US008155257B2

(12) United States Patent
Okamoto

(10) Patent No.: US 8,155,257 B2
(45) Date of Patent: Apr. 10, 2012

(54) SYNCHRONIZING CIRCUIT AND CONTROLLING METHOD THEREOF

(75) Inventor: Ikko Okamoto, Tokyo (JP)

(73) Assignee: Sony Corporation, Tokyo (JP)

( * ) Notice: Subject to any disclaimer, the term of this patent is extended or adjusted under 35 U.S.C. 154(b) by 834 days.

(21) Appl. No.: 12/109,708

(22) Filed: Apr. 25, 2008

(65) Prior Publication Data

US 2008/0267336 A1 Oct. 30, 2008

(30) Foreign Application Priority Data

Apr. 27, 2007 (JP) ................................ P2007-118941

(51) Int. Cl.
*H03D 3/24* (2006.01)

(52) U.S. Cl. ........ 375/376; 375/371; 327/147; 327/156; 332/127; 329/307

(58) Field of Classification Search .................. 375/376, 375/371; 327/147, 156; 329/307; 332/127
See application file for complete search history.

(56) References Cited

U.S. PATENT DOCUMENTS 6,081,563 A * 6/2000 Taga et al. .................... 375/344
6,148,046 A * 11/2000 Hussein et al. ............... 375/345
6,597,754 B1 * 7/2003 Janesch et al. ............... 375/376
7,203,261 B2 * 4/2007 Gupta .......................... 375/376
7,483,508 B2 * 1/2009 Staszewski et al. ........... 375/376
7,825,739 B2 * 11/2010 Higashino ...................... 331/17
7,933,322 B2 * 4/2011 Jin et al. ........................ 375/226
2004/0202271 A1 * 10/2004 Fahim .......................... 375/376
2006/0215778 A1 * 9/2006 Murthy et al. ................ 375/260
2008/0136510 A1 * 6/2008 Iida et al. ...................... 329/307
2008/0267336 A1 * 10/2008 Okamoto ...................... 375/376

FOREIGN PATENT DOCUMENTS

JP 2002 111768 4/2002

* cited by examiner

*Primary Examiner* — Shuwang Liu
*Assistant Examiner* — Sung Ahn
(74) *Attorney, Agent, or Firm* — Frommer Lawrence & Haug LLP; William S. Frommer; Ellen Marcie Emas

(57) ABSTRACT

Disclosed herein is synchronizing circuit including: a numerically controlled oscillating section; a phase rotating section; a phase error estimating section; a loop filter; and a gain controlling section; wherein the gain controlling section controls the gain so as to suppress an effect of a phase error in an immediate main signal section in a known start section from a start of the known section to a predetermined symbol.

6 Claims, 13 Drawing Sheets

PHASE ERROR QUANTITY OF INPUT SYMBOL

PHASE PULL-IN

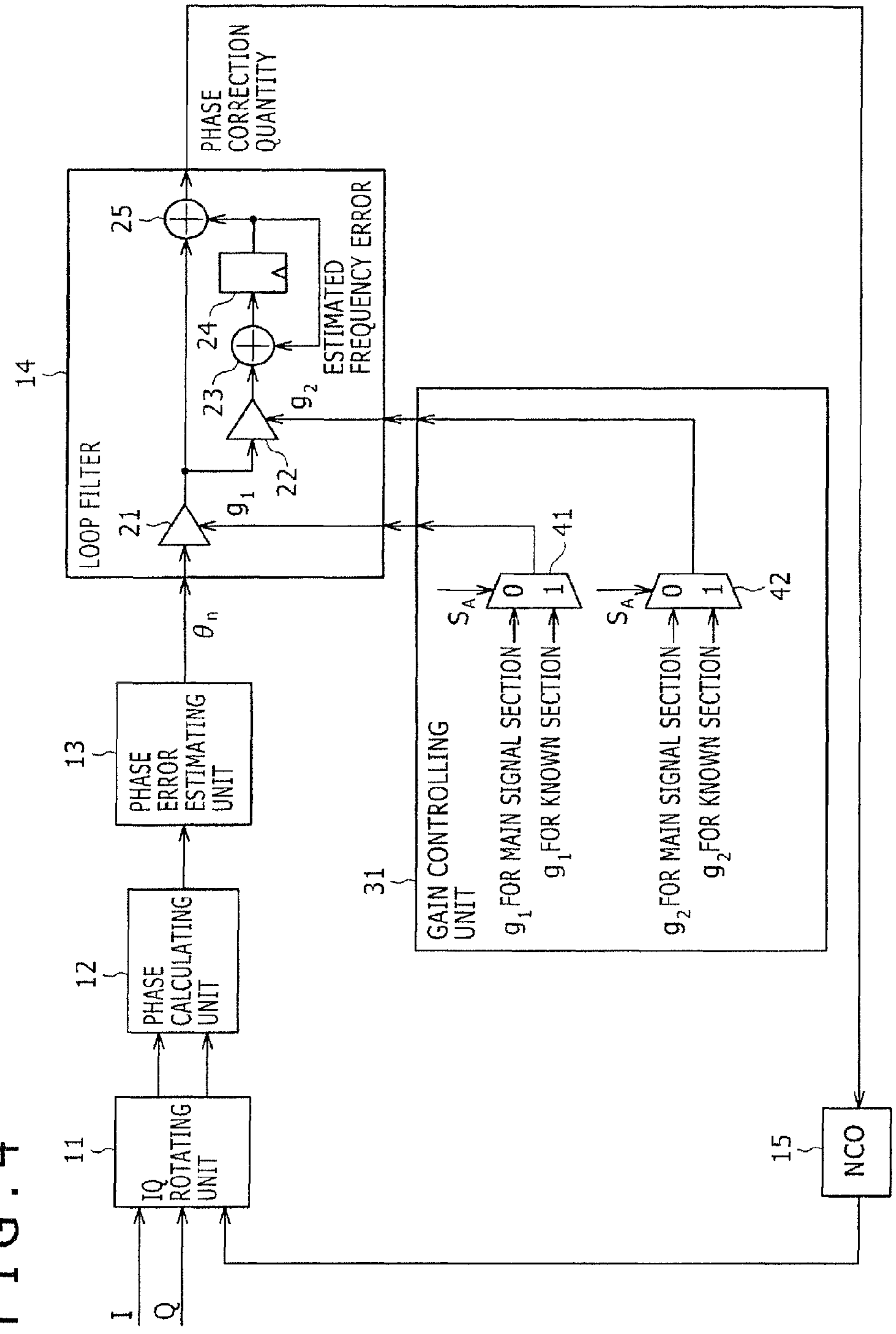
F I G . 4

PHASE ROTATION IN MAIN SIGNAL SECTION

I
Q
111
IQ ROTATING UNIT
112
PHASE CALCULATING UNIT
113
PHASE ERROR ESTIMATING UNIT
$\theta_n$
114
LOOP FILTER
121
122
123
124
125
$g_1$
$g_2$
ESTIMATED FREQUENCY ERROR
PHASE CORRECTION QUANTITY
116
GAIN CONTROLLING UNIT
$S_A$
$g_1$ FOR MAIN SIGNAL SECTION
$g_1$ FOR KNOWN SECTION
131
$S_A$
$g_2$ FOR MAIN SIGNAL SECTION
$g_2$ FOR KNOWN SECTION
$S_B$
0
1
132
133
115
NCO

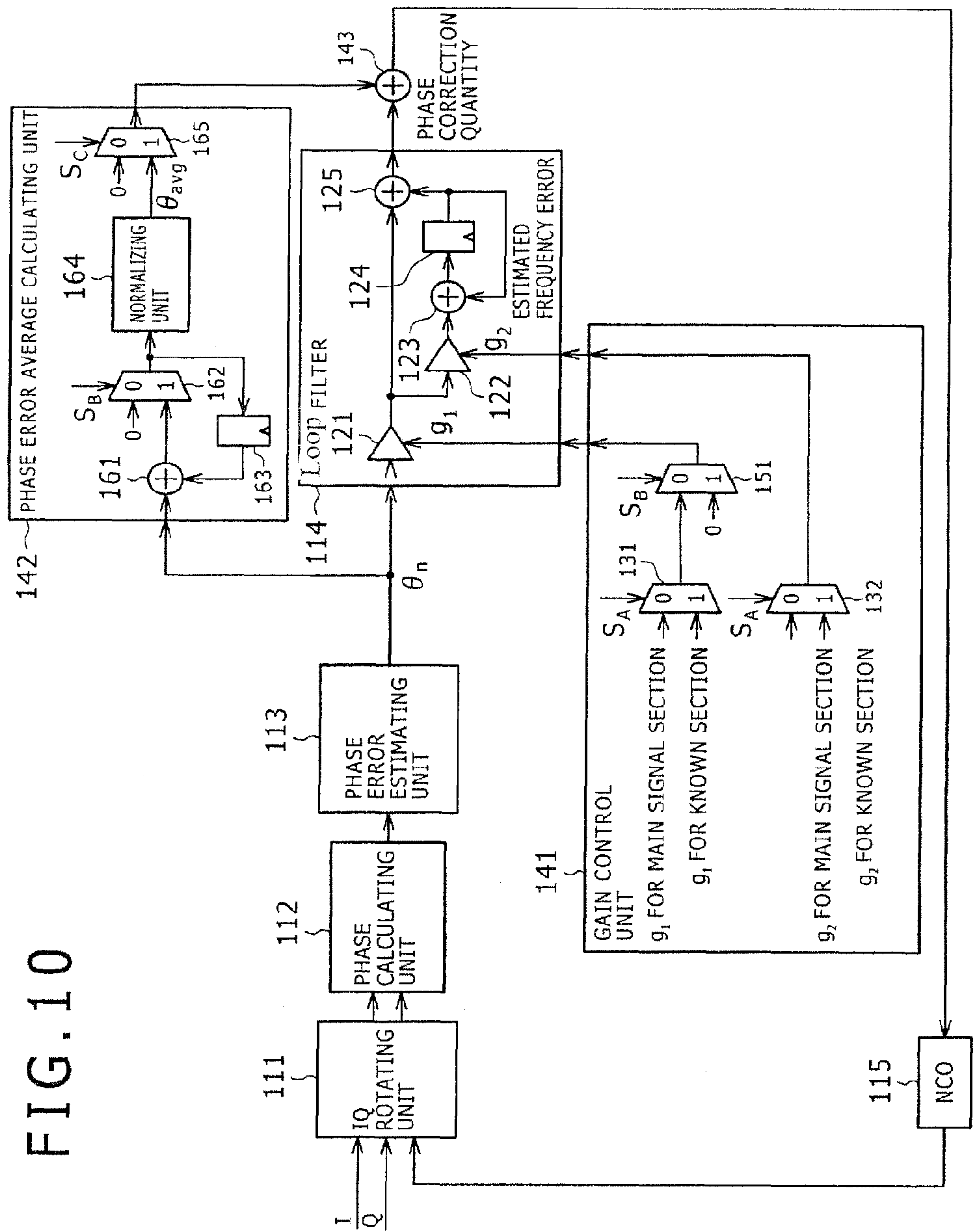
FIG. 10
I
Q
111
IQ ROTATING UNIT
112
PHASE CALCULATING UNIT
113
PHASE ERROR ESTIMATING UNIT
$\theta_n$
114
Loop FILTER
121
122
123
124
125
$g_1$
$g_2$
ESTIMATED FREQUENCY ERROR
142
PHASE ERROR AVERAGE CALCULATING UNIT
161
162
163
164
NORMALIZING UNIT
165
$S_B$
$S_C$
0
1
$\theta_{avg}$
143
PHASE CORRECTION QUANTITY
141
GAIN CONTROL UNIT
$g_1$ FOR MAIN SIGNAL SECTION
$g_1$ FOR KNOWN SECTION
$g_2$ FOR MAIN SIGNAL SECTION
$g_2$ FOR KNOWN SECTION
$S_A$
131
132
151
115
NCO FIG. 11 PHASE ERROR AVERAGE CALCULATION IN KNOWN SECTION
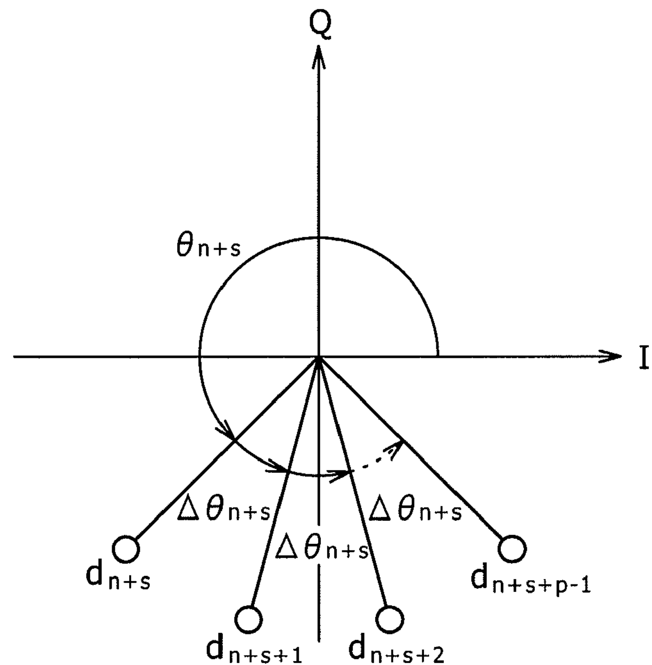
FIG. 12 PHASE ERROR CORRECTION
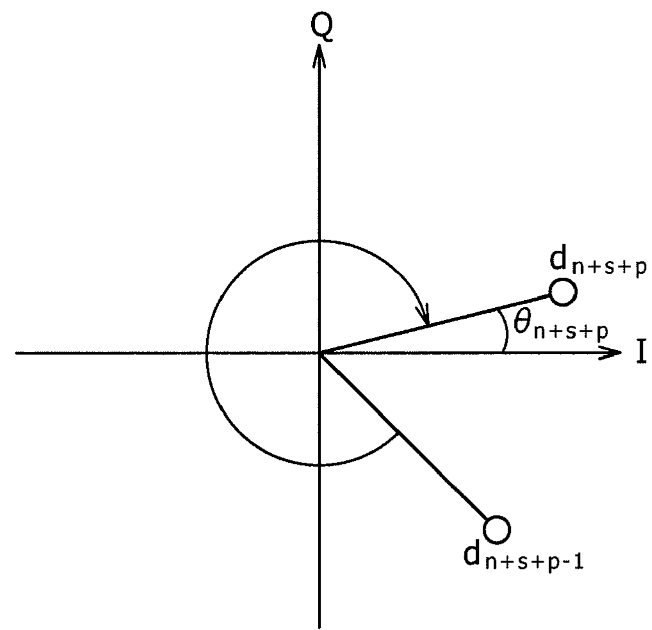

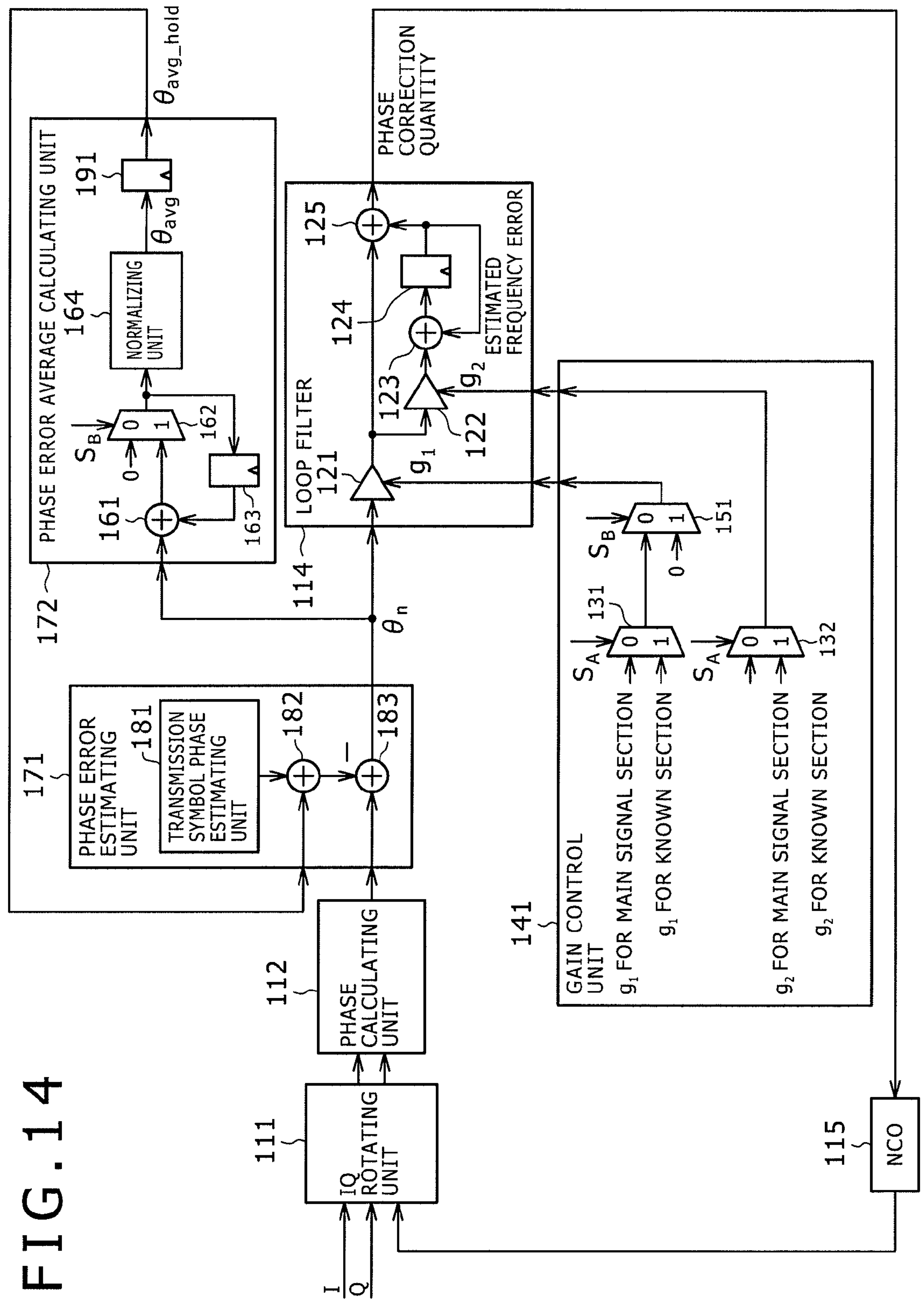
FIG. 14
I
Q
111
IQ ROTATING UNIT
112
PHASE CALCULATING UNIT
171
PHASE ERROR ESTIMATING UNIT
181
TRANSMISSION SYMBOL PHASE ESTIMATING UNIT
182
183
−
$\theta_n$
172
PHASE ERROR AVERAGE CALCULATING UNIT
161
162
163
164
NORMALIZING UNIT
191
$S_B$
0
1
$\theta_{avg}$
$\theta_{avg\_hold}$
114
LOOP FILTER
121
122
123
124
125
$g_1$
$g_2$
ESTIMATED FREQUENCY ERROR
PHASE CORRECTION QUANTITY
141
GAIN CONTROL UNIT
$g_1$ FOR MAIN SIGNAL SECTION
$g_1$ FOR KNOWN SECTION
$g_2$ FOR MAIN SIGNAL SECTION
$g_2$ FOR KNOWN SECTION
$S_A$
131
132
151
115
NCO

SYNCHRONIZING CIRCUIT AND CONTROLLING METHOD THEREOF

CROSS REFERENCES TO RELATED APPLICATIONS

The present invention contains subject matter related to Japanese Patent Application JP 2007-118941 filed in the Japan Patent Office on Apr. 27, 2007, the entire contents of which being incorporated herein by reference.

BACKGROUND OF THE INVENTION

1. Field of the Invention

The present invention relates to a synchronizing circuit and a controlling method of the synchronizing circuit, and particularly to a synchronizing circuit and a controlling method of the synchronizing circuit that can improve performance of a receiving device receiving a modulated signal resulting from digital modulation, for example.

2. Description of the Related Art

FIG. 1 is a block diagram showing a conventional carrier frequency/phase synchronizing circuit based on a digital PLL (Phase Locked Loop).

Incidentally, suppose in this case that an input symbol (IQ signal) input to the carrier frequency/phase synchronizing circuit of FIG. 1 has a carrier frequency error and a phase error.

An IQ rotating unit 11 rotates the phase of the input symbol so as to correct a signal of a phase from an NCO (Numerically Controlled Oscillator) 15 to be described later according to the signal of the phase. The IQ rotating unit 11 then supplies the input symbol after the phase rotation to a phase calculating unit 12.

The phase calculating unit 12 calculates an argument of the input symbol supplied from the IQ rotating unit 11, and then supplies the argument to a phase error estimating unit 13.

The phase error estimating unit 13 estimates a phase error $\theta_n$ of the input symbol from the argument supplied from the phase calculating unit 12, and then outputs the phase error $\theta_n$ to a loop filter 14.

As to the phase error $\theta_n$, in a case of a known symbol, which is a symbol whose argument is already known, in for example a frame header or a pilot signal forming a frame, a phase difference between the known symbol and an ideal signal point of the known symbol is output as the phase error $\theta_n$. In addition, a modulated main signal symbol is judged by hard decision to be at a signal point according to a signal constellation of the main signal symbol, and a phase difference between the main signal symbol and an ideal signal point of the main signal symbol is output as the phase error $\theta_n$.

The loop filter 14 includes an amplifier 21, an amplifier 22, an arithmetic unit 23, a register 24, and an arithmetic unit 25. The loop filter 14 filters the phase error $\theta_n$ supplied from the phase error estimating unit 13, and controls the NCO 15 to be described later according to a result of the filtering.

Specifically, in the loop filter 14, the phase error $\theta_n$ is multiplied by a loop gain $g_1$ and a loop gain $g_2$ by the amplifier 21 and the amplifier 22, and a resulting value is added to the register 24. Then, a sum of an output value of the register 24 and a value obtained by multiplying the phase error $\theta_n$ by only the loop gain $g_1$ by the amplifier 21 is output as a phase correction quantity. Incidentally, the output value of the register 24 converges to a value (estimated frequency error) corresponding to the frequency error of the input symbol.

The NCO 15 generates a signal of a predetermined phase according to the output from the loop filter 14. The NCO 15 then supplies the IQ rotating unit 11 with the signal of the predetermined phase as a signal corresponding to an original signal point (ideal signal point) on an IQ plane of the input symbol.

That is, a receiving device having the carrier frequency/phase synchronizing circuit of FIG. 1 demodulates a modulated signal into a demodulated signal including an I-component in phase with a carrier and a Q-component orthogonal to the carrier by multiplying the modulated signal by the carrier. However, there is generally an error between the carrier used on the receiving side and a carrier used on a transmitting side that transmits the modulated signal. Due to the error, the symbol (input symbol) of the demodulated signal obtained on the receiving side is rotated in the IQ plane defined by an I-axis indicating the I-component and a Q-axis indicating the Q-component.

That is, the receiving device establishes carrier synchronism to compensate for the rotation of the symbol (input symbol) of the demodulated signal as described above. Specifically, for example, in the receiving device, a phase error $\theta_n$ between the signal of the predetermined phase which signal is output by the NCO 15 and the input symbol is detected, and the phase error $\theta_n$ is filtered by the loop filter 14. Then, the NCO 15 is controlled according to a result of the filtering of the loop filter 14, while the phase of the input symbol is rotated so as to correct the phase error $\theta_n$ according to the phase error $\theta_n$.

Specifically, as shown in FIG. 2 and FIG. 3, the phase error quantity of an input symbol can be expressed on an IQ plane.

Letting $s_n$ be an nth input symbol, and $r_n$ be an ideal signal point of the nth input symbol, $d_n$ is defined as in the following Equation (1). Incidentally, n is a natural number.

$$d_n = s_n - r_n \tag{1}$$

The argument of $d_n$ corresponds to the detected phase error $\theta_n$.

In addition, letting $\Delta\theta$ be an amount of phase rotation per symbol due to a frequency error, the relation of the following Equation (2) holds when phase correction is not made.

$$\theta_{n+1} = \theta_n + \Delta\theta \tag{2}$$

That is, as shown in FIG. 2, the phase error of the nth input symbol is $\theta_n$, the phase error of a following (n+1)th input symbol is $\theta_n+\Delta\theta$, the phase error of an (n+2)th input symbol is $\theta_{n+1}+\Delta\theta$, the phase error of an (n+3)th input symbol is $\theta_{n+2}+\Delta\theta$, . . . .

When phase correction is made for a period of m symbols from the (n+1)th symbol in a condition free from a frequency error, the relation of the following Equation (3) holds.

$$\theta_{n+m} = (1g_1)^m \theta_n \tag{3}$$

In Equation (3), when $g_1<1$, the phase error $\theta_{n+m}$ eventually converges to 0. The phase pull-in is shown in FIG. 3. In FIG. 3, the phase error $\theta_n$ of the nth input symbol when phase correction is thereafter made for the period of the m symbols from the (n+1)th symbol is phase-rotated to the phase error $\theta_{n+m}$ of an (n+m)th input symbol.

When the input symbol has a frequency error, $\Delta\theta$ as shown in Equation (2) is added to the phase error $\theta_{n+m}$ of the (n+m)th input symbol for each symbol. This $\theta_n$ is multiplied by the loop gain $g_1$ and the loop gain $g_2$, and then added to the register 24 within the loop filter 14. Hence, carrier synchronism is established when a value stored in the register 24 balances $\Delta\theta$.

As compared with a phase error detected from a known symbol, a phase error detected from a PSK (Phase Shift Keying) modulated main signal symbol is low in reliability because there is a fear of the phase error being erroneously detected due to an erroneous estimation of an estimated signal point of the main signal symbol. Accordingly, the present applicant has previously proposed a technique for controlling the loop gains according to the types of these symbols (see Japanese Patent Laid-Open No. 2002-111768, for example).

In the previous proposition, the loop gains are increased for a known symbol of high reliability, and the loop gains are relatively decreased for a main signal symbol of low reliability, whereby the effect of a phase error of higher reliability is increased, and a detected frequency error is made to converge more quickly.

A carrier frequency/phase synchronizing circuit as shown in FIG. 4 is a circuit that realizes a function of controlling the loop gains.

As compared with the carrier frequency/phase synchronizing circuit of FIG. 1, the carrier frequency/phase synchronizing circuit of FIG. 4 is further provided with a gain controlling unit 31. The gain controlling unit 31 controls the loop gain $g_1$ of an amplifier 21 and the loop gain $g_2$ of an amplifier 22 within a loop filter 14.

The control of the loop gain $g_1$ and the loop gain $g_2$ by the gain controlling unit 31 in FIG. 4 will be described in the following with reference to a timing chart of FIG. 5.

The timing chart of FIG. 5 shows a symbol number, which is a number serially given to a known symbol and a main signal symbol, frame information indicating either a section of main signal symbols (main signal section) or a section of known symbols (known section), a selection signal $S_A$ for the selection of the loop gains $g_1$ and $g_2$ for the known section and the main signal section, the loop gain $g_1$, and the loop gain $g_2$ in this order from the top of the figure.

A direction of time is a direction of going from a left to a right of FIG. 5. Incidentally, the direction of time is the same in other timing charts to be described later.

In FIG. 5, s is the number of symbols in a main signal section, and t is the number of symbols in a known section. Hence, when a change is made from a known section to a main signal section at an nth symbol, as shown in FIG. 5, a change is made to a next known section at an (n+s)th symbol, and then a change is made to a next main signal section at an (n+s+t)th symbol. The selection signal $S_A$ is 0 when the input symbol is a main signal symbol, and is 1 when the input symbol is a known symbol.

As shown in FIG. 5, in the gain controlling unit 31, when the input symbol is a main signal symbol, the selection signal $S_A$ is 0. Thus, a selector 41 outputs the loop gain $g_1$ for a main signal section to the amplifier 21, and a selector 42 outputs the loop gain $g_2$ for a main signal section to the amplifier 22. When the input symbol is a known symbol, the selection signal $S_A$ is 1. Thus, the selector 41 outputs the loop gain $g_1$ for a known section to the amplifier 21, and the selector 42 outputs the loop gain $g_2$ for a known section to the amplifier 22.

That is, the gain controlling unit 31 changes the loop gains $g_1$ and $g_2$ output to the loop filter 14 from the loop gains $g_1$ and $g_2$ for a main signal section to the loop gains $g_1$ and $g_2$ for a known section or changes the loop gains $g_1$ and $g_2$ output to the loop filter 14 from the loop gains $g_1$ and $g_2$ for a known section to the loop gains $g_1$ and $g_2$ for a main signal section according to the selection signal $S_A$.

As described above, the carrier frequency/phase synchronizing circuit of FIG. 4 controls the loop gains $g_1$ and $g_2$ so as to increase the loop gains for a known symbol of high reliability and conversely relatively decrease the loop gains for a main signal symbol of low reliability.

SUMMARY OF THE INVENTION

However, in the above Patent Document 1, when the loop gain for a main signal symbol is decreased, phase rotation in the main signal section may not be stopped in a condition of a large frequency error or in a low C/N (Carrier to Noise Ratio) environment.

Specifically, supposing that a difference between the frequency error of the input symbol and an estimated frequency error is a residual frequency error, a phase rotation as shown in FIG. 6 may occur during the period of s symbols, depending on the conditions of the residual frequency error at the (n+s)th symbol at which a change is made from the main signal section to the known section, an amount of noise, and the loop gains. FIG. 6 shows a phase rotation due to a phase error $\theta_{n+s}$ of the period of the s symbols (main signal section) from the nth main signal symbol.

Thus, there is a fear that the phase error $\theta_{n+s}$ detected at the symbol ((n+s)th symbol) at a start of the next known section may include an error that prevents the convergence of the loop filter.

When the phase error $\theta_{n+s}$ is referred to as an initial phase error, because of the known section at this time, the initial phase error is multiplied by the relatively high gains within the loop filter, and then added to the register. Hence, when the initial phase error is significantly larger than the amount of phase rotation due to the residual frequency error, control for frequency correction is applied excessively.

In addition, when the phase rotation during the period of the s symbols exceeds $\pi$ (rad), and the sign of the initial phase error and the sign of the amount of phase rotation due to the residual frequency error become opposite to each other, control acts in an opposite direction.

Thus, the PLL is erroneously synchronized with a frequency error of an integral multiple of a cycle in which a known symbol appears within a frame. Consequently, a capture range for frequency synchronization is narrowed, and the PLL does not converge in a low C/N environment, so that phase synchronization may not be established.

The present invention has been made in view of such a situation. It is desirable to suppress the effect of phase rotation in an immediate main signal section in a known section, and improve performance of a receiving device receiving a modulated signal resulting from digital modulation.

According to an embodiment of the present invention, there is provided a synchronizing circuit including: numerically controlled oscillating means for generating a signal of a predetermined phase; phase rotating means for rotating a phase of a symbol of a demodulated signal obtained by demodulating a modulated signal resulting from digital modulation of a carrier according to the signal of the predetermined phase, the demodulated signal including an I-component in phase with the carrier and a Q-component orthogonal to the carrier; phase error estimating means for estimating a phase error from the rotated phase of the symbol of the demodulated signal; a loop filter for filtering the phase error and controlling the numerically controlled oscillating means according to a result of the filtering; and gain controlling means for controlling a gain of the loop filter in symbol units of the demodulated signal, the symbol units forming one of a known section as a section of known symbols and a main signal section as a section of main signal symbols; wherein the gain controlling means controls the gain so as to suppress an effect of a phase error in an immediate main signal section in a known start section from a start of the known section to a predetermined symbol.

The gain controlling means can control the gain such that 0 is added as a value of the phase error in the immediate main signal section to a value retained at a time of filtering by the loop filter in the known start section.

The synchronizing circuit can further include: phase error average calculating means for calculating an average value of the phase error in the known start section; and adding means for adding the calculated average value to a phase correction quantity as output of the loop filter; wherein the gain controlling means can control the gain such that phase error correction in the known start section is stopped in the loop filter, the adding means can add the average value to the phase correction quantity when the symbol of the demodulated signal becomes the predetermined symbol, and the numerically controlled oscillating means can generate the signal of the predetermined phase according to the phase correction quantity to which the average value is added.

The synchronizing circuit can further include phase error average calculating means for calculating an average value of the phase error in the known start section, wherein the phase error estimating means can estimate the phase error from a difference between the phase of the symbol of the demodulated signal and a phase obtained by adding the calculated average value to an ideal signal point when the symbol of the demodulated signal becomes the predetermined symbol, the gain controlling means can control the gain such that phase error correction in the known start section is stopped in the loop filter, and the loop filter can subject the estimated phase error to filtering and control the numerically controlled oscillating means according to a result of the filtering.

The main signal section can be a data section, and the known section can be a frame header and a pilot signal when the pilot signal is inserted and can be a frame header when the pilot signal is not inserted.

A controlling method according to an embodiment of the present invention is a method corresponding to a synchronizing circuit controlling method of the synchronizing circuit according to the above-described embodiment of the present invention.

In the synchronizing circuit and the controlling method of the synchronizing circuit according to the above-described embodiments of the present invention, in the synchronizing circuit including numerically controlled oscillating means for generating a signal of a predetermined phase, phase rotating means for rotating a phase of a symbol of a demodulated signal obtained by demodulating a modulated signal resulting from digital modulation of a carrier according to the signal of the predetermined phase, the demodulated signal including an I-component in phase with the carrier and a Q-component orthogonal to the carrier, phase error estimating means for estimating a phase error from the rotated phase of the symbol of the demodulated signal, a loop filter for filtering the phase error and controlling the numerically controlled oscillating means according to a result of the filtering, and gain controlling means for controlling a gain of the loop filter in symbol units of the demodulated signal, the symbol units forming one of a known section as a section of known symbols and a main signal section as a section of main signal symbols, the following process is performed. The gain is controlled so as to suppress an effect of a phase error in an immediate main signal section in a known start section from a start of the known section to a predetermined symbol.

As described above, according to an embodiment of the present invention, it is possible to improve performance of a receiving device receiving a modulated signal resulting from digital modulation. In particular, according to an embodiment of the present invention, by suppressing an effect of a phase rotation in an immediate main signal section in a known start section, it is possible to make the convergence of the PLL accurate, and establish synchronization stably and surely.

BRIEF DESCRIPTION OF THE DRAWINGS

FIG. 3 is a diagram of assistance in explaining phase pull-in;

FIG. 4 is a block diagram showing a conventional carrier frequency/phase synchronizing circuit;

FIG. 10 is a block diagram of assistance in explaining another configuration of an embodiment of a carrier frequency/phase synchronizing circuit to which the present invention is applied;

FIG. 11 is a diagram of assistance in explaining calculation of a phase error average in a known section;

FIG. 12 is a diagram of assistance in explaining phase error correction;

FIG. 14 is a block diagram of assistance in explaining another configuration of an embodiment of a carrier frequency/phase synchronizing circuit to which the present invention is applied.

DETAILED DESCRIPTION OF PREFERRED EMBODIMENTS

Preferred embodiments of the present invention will hereinafter be described. Correspondences between constitutional requirements of the present invention and embodiments described in the specification or the drawings are illustrated as follows. This description is to confirm that embodiments supporting the present invention are described in the specification or the drawings. Therefore, even when there is an embodiment described in the specification or drawings but not described here as an embodiment corresponding to a constitutional requirement of the present invention, it does not signify that the embodiment does not correspond to the constitutional requirement. Conversely, even when an embodiment is described here as corresponding to a constitutional requirement, it does not signify that the embodiment does not correspond to constitutional requirements other than that constitutional requirement.

Figure 7:
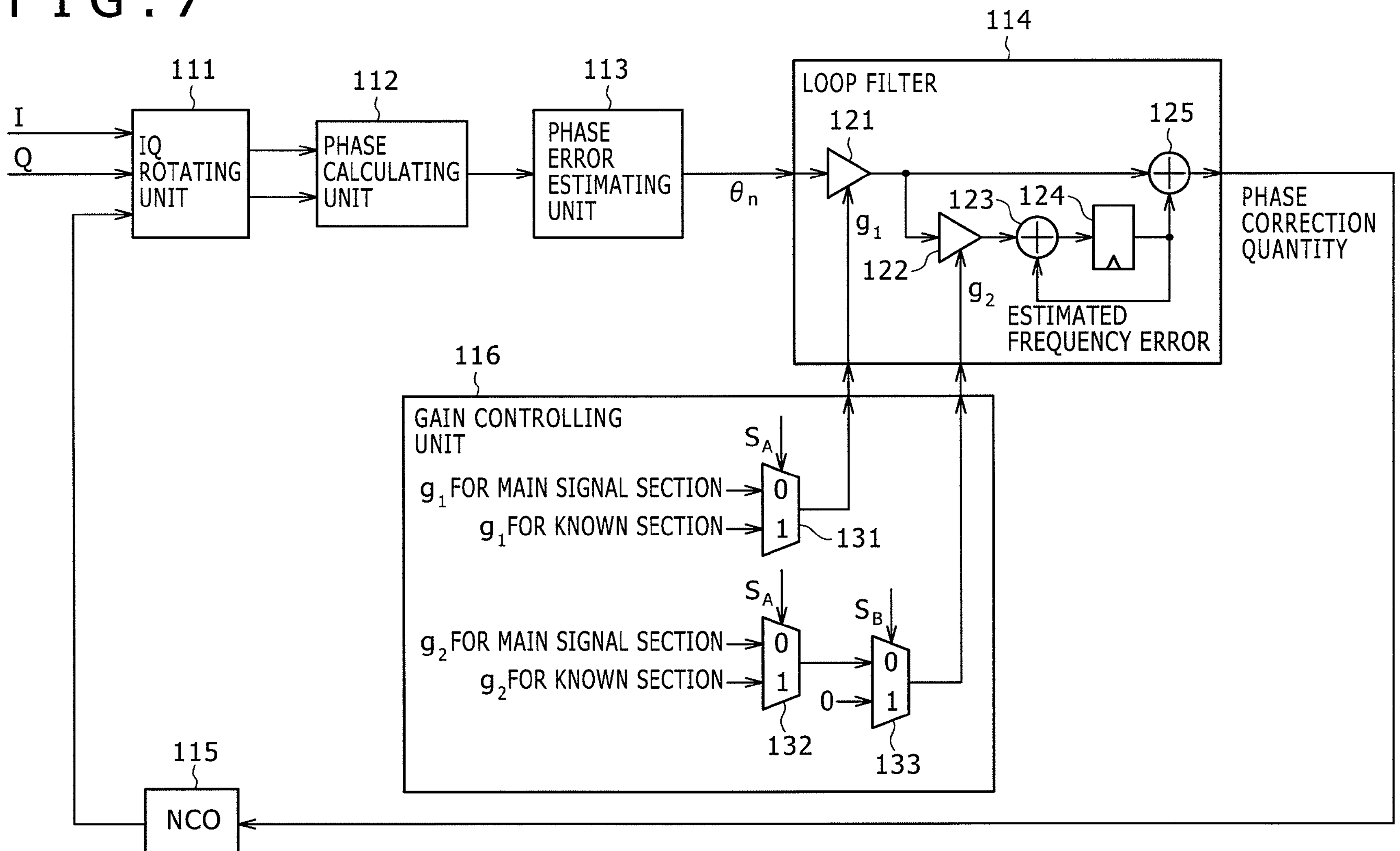
FIG. 7 is a block diagram of assistance in explaining a configuration of an embodiment of a carrier frequency/phase synchronizing circuit to which the present invention is applied.
Figure 9:
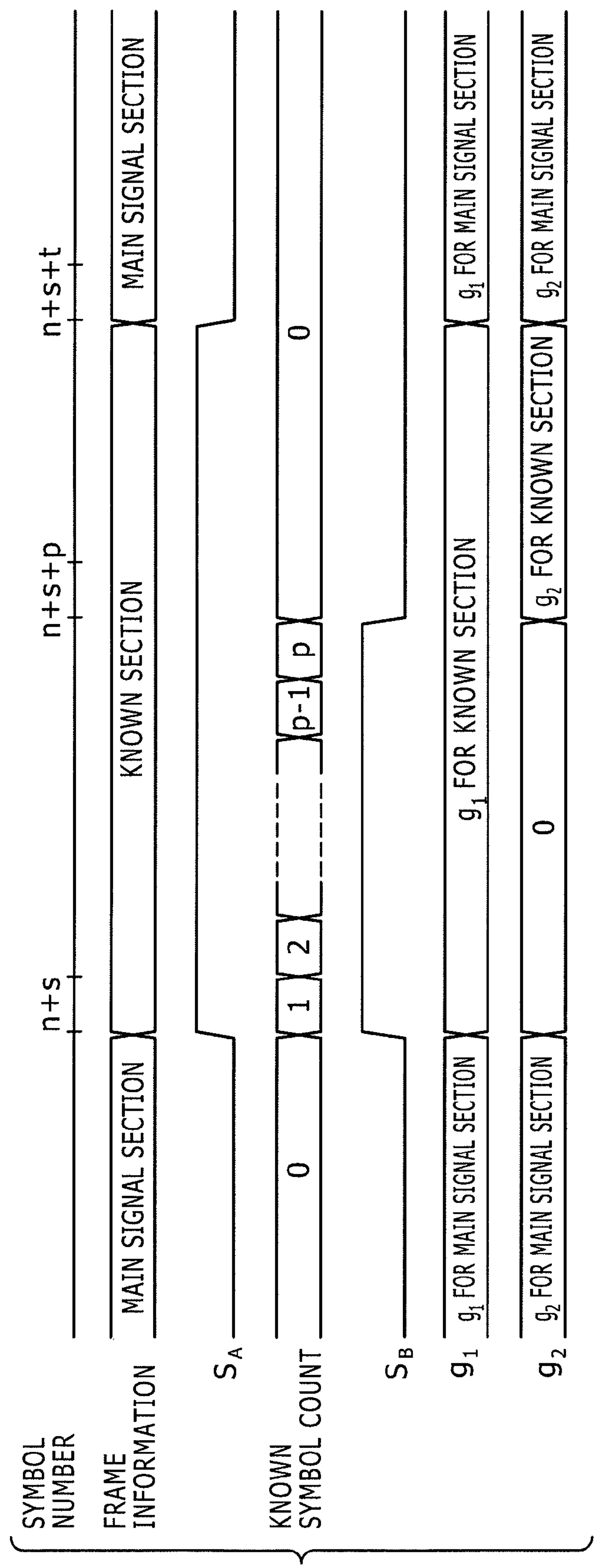
FIG. 9 is a timing chart of assistance in explaining operation of the carrier frequency/phase synchronizing circuit of FIG. 7.

A synchronizing circuit (for example a carrier frequency/phase synchronizing circuit in FIG. 7) according to an embodiment of the present invention includes: numerically controlled oscillating means (for example an NCO 115 in FIG. 7) for generating a signal of a predetermined phase; phase rotating means (an IQ rotating unit 111 in FIG. 7) for rotating a phase of a symbol of a demodulated signal obtained by demodulating a modulated signal resulting from digital modulation of a carrier according to the signal of the predetermined phase, the demodulated signal including an I-component in phase with the carrier and a Q-component orthogonal to the carrier; phase error estimating means (for example a phase error estimating unit 113 in FIG. 7) for estimating a phase error (for example a phase error $\theta_n$) from the rotated phase of the symbol of the demodulated signal; a loop filter (for example a loop filter 114 in FIG. 7) for filtering the phase error and controlling the numerically controlled oscillating means according to a result of the filtering; and gain controlling means (for example a gain controlling unit 116 in FIG. 7) for controlling a gain of the loop filter in symbol units of the demodulated signal, the symbol units forming one of a known section as a section of known symbols and a main signal section as a section of main signal symbols; wherein the gain controlling means controls the gain so as to suppress an effect of a phase error in an immediate main signal section in a known start section from a start of the known section to a predetermined symbol (for example a pth symbol) (for example a timing chart of FIG. 9).

The gain controlling means controls the gain such that 0 is added as a value of the phase error in the immediate main signal section to a value retained at a time of filtering by the loop filter in the known start section (for example a timing chart of FIG. 9).

Figure 13:
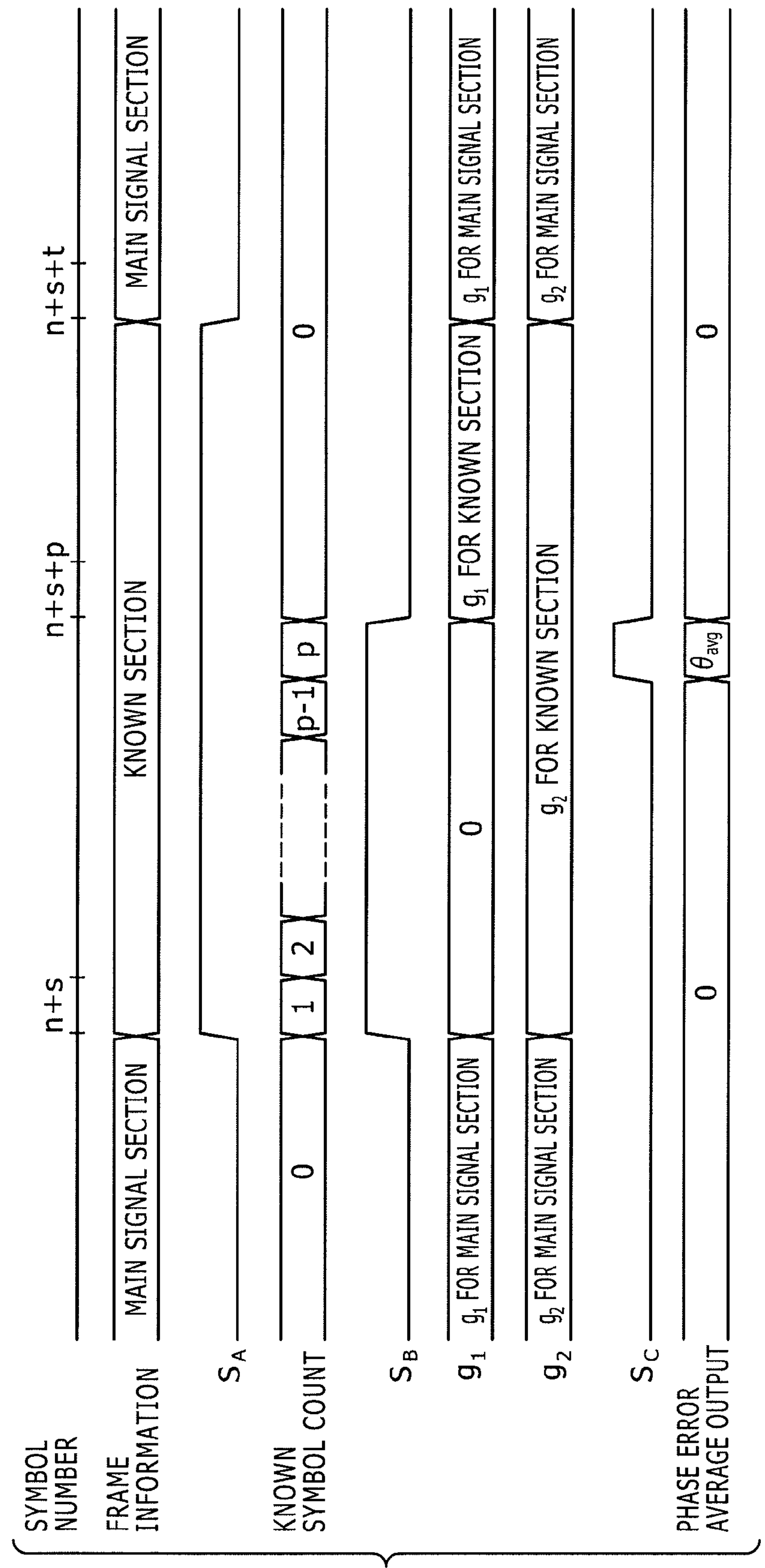
FIG. 13 is a timing chart of assistance in explaining operation of the carrier frequency/phase synchronizing circuit of FIG. 10.

The synchronizing circuit further includes: phase error average calculating means (for example a phase error average calculating unit 142 in FIG. 10) for calculating an average value of the phase error in the known start section; and adding means (for example an arithmetic unit 143 in FIG. 10) for adding the calculated average value to a phase correction quantity as output of the loop filter; wherein the gain controlling means controls the gain such that phase error correction in the known start section is stopped in the loop filter, the adding means adds the average value to the phase correction quantity when the symbol of the demodulated signal becomes the predetermined symbol, and the numerically controlled oscillating means generates the signal of the predetermined phase according to the phase correction quantity to which the average value is added (for example a timing chart of FIG. 13).

Figure 15:
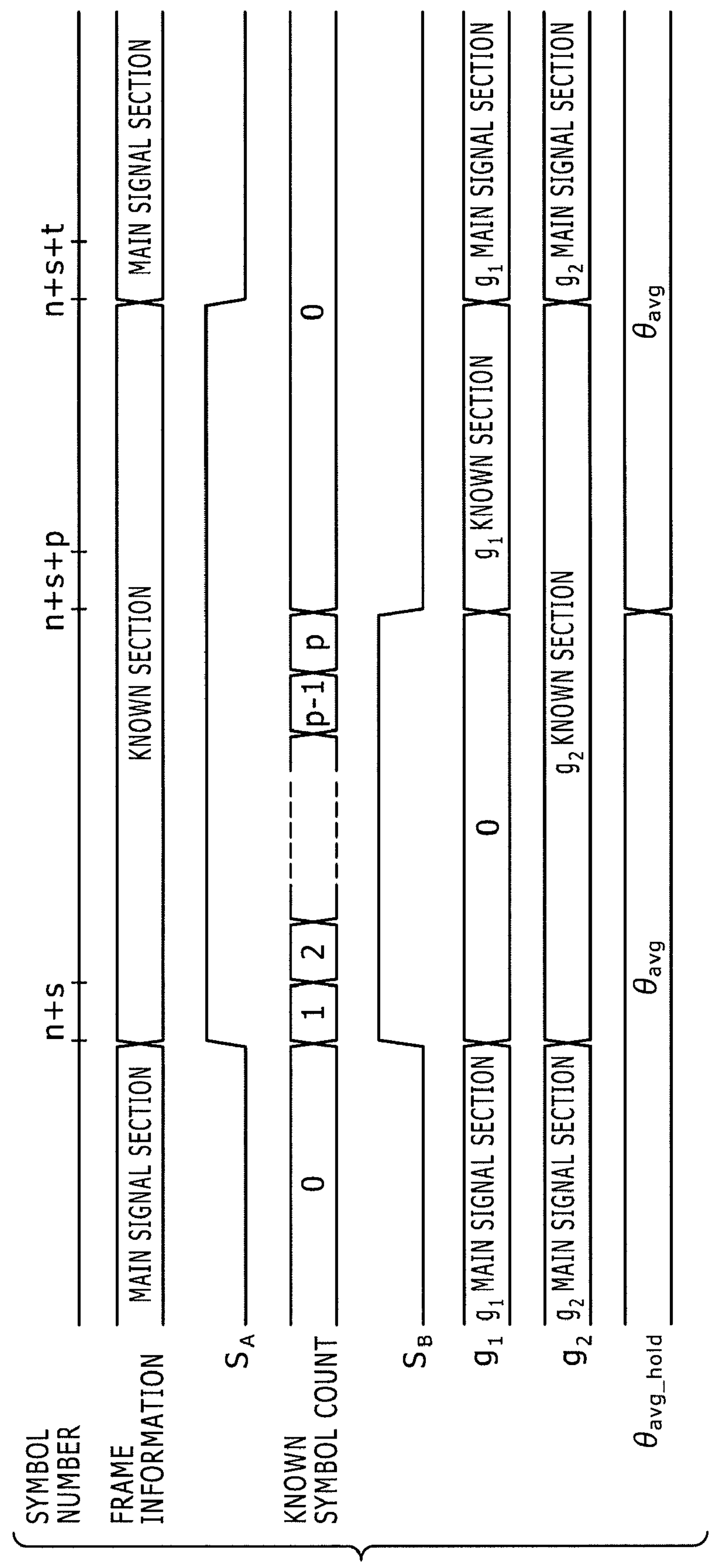
FIG. 15 is a timing chart of assistance in explaining operation of the carrier frequency/phase synchronizing circuit of FIG. 14.

The synchronizing circuit further includes phase error average calculating means (for example a phase error average calculating unit 172 in FIG. 14) for calculating an average value of the phase error in the known start section, wherein the phase error estimating means estimates the phase error from a difference between the phase of the symbol of the demodulated signal and a phase obtained by adding the calculated average value to an ideal signal point when the symbol of the demodulated signal becomes the predetermined symbol, the gain controlling means controls the gain such that phase error correction in the known start section is stopped in the loop filter, and the loop filter subjects the estimated phase error to filtering and controls the numerically controlled oscillating means according to a result of the filtering (for example a timing chart of FIG. 15).

A control method of a synchronizing circuit according to an embodiment of the present invention is a control method of a synchronizing circuit (for example a carrier frequency/phase synchronizing circuit in FIG. 7), the synchronizing circuit including numerically controlled oscillating means (for example an NCO 115 in FIG. 7) for generating a signal of a predetermined phase, phase rotating means (an IQ rotating unit 111 in FIG. 7) for rotating a phase of a symbol of a demodulated signal obtained by demodulating a modulated signal resulting from digital modulation of a carrier according to the signal of the predetermined phase, the demodulated signal including an I-component in phase with the carrier and a Q-component orthogonal to the carrier, phase error estimating means (for example a phase error estimating unit 113 in FIG. 7) for estimating a phase error (for example a phase error $\theta_n$) from the rotated phase of the symbol of the demodulated signal, a loop filter (for example a loop filter 114 in FIG. 7) for filtering the phase error and controlling the numerically controlled oscillating means according to a result of the filtering, and gain controlling means (for example a gain controlling unit 116 in FIG. 7) for controlling a gain of the loop filter in symbol units of the demodulated signal, the symbol units forming one of a known section as a section of known symbols and a main signal section as a section of main signal symbols, the control method including: controlling the gain so as to suppress an effect of a phase error in an immediate main signal section in a known start section from a start of the known section to a predetermined symbol (for example a pth symbol) (for example a timing chart of FIG. 9).

Preferred embodiments of the present invention will hereinafter be described with reference to the drawings.

FIG. 7 is a block diagram of assistance in explaining a configuration of an embodiment of a carrier frequency/phase synchronizing circuit to which the present invention is applied.

The carrier frequency/phase synchronizing circuit of FIG. 7 includes an IQ rotating unit 111, a phase calculating unit 112, a phase error estimating unit 113, a loop filter 114, an NCO 115, and a gain controlling unit 116. Incidentally, while the configuration of the gain controlling unit 116 in the carrier frequency/phase synchronizing circuit of FIG. 7 is different from that of the conventional carrier frequency/phase synchronizing circuit of FIG. 4, other blocks of the carrier frequency/phase synchronizing circuit of FIG. 7 have similar configurations to those of the conventional carrier frequency/phase synchronizing circuit of FIG. 4.

The IQ rotating unit 111 is supplied with a signal of a predetermined phase from the NCO 115 as well as an input symbol (IQ signal). The IQ rotating unit 111 rotates the phase of the input symbol so as to correct the signal of the phase from the NCO 115 according to the signal of the phase. The IQ rotating unit 111 then supplies the input symbol after the rotation of the phase to the phase calculating unit 112.

In this case, the input symbol (IQ signal) is a demodulated signal obtained by demodulating a modulated signal resulting from digital modulation of a carrier, the demodulated signal including an I-component in phase with the carrier and a Q-component orthogonal to the carrier. As a standard for transmitting this modulated signal, there is a DVB-S.2 standard as a satellite digital broadcasting standard, for example.

Figure 8:
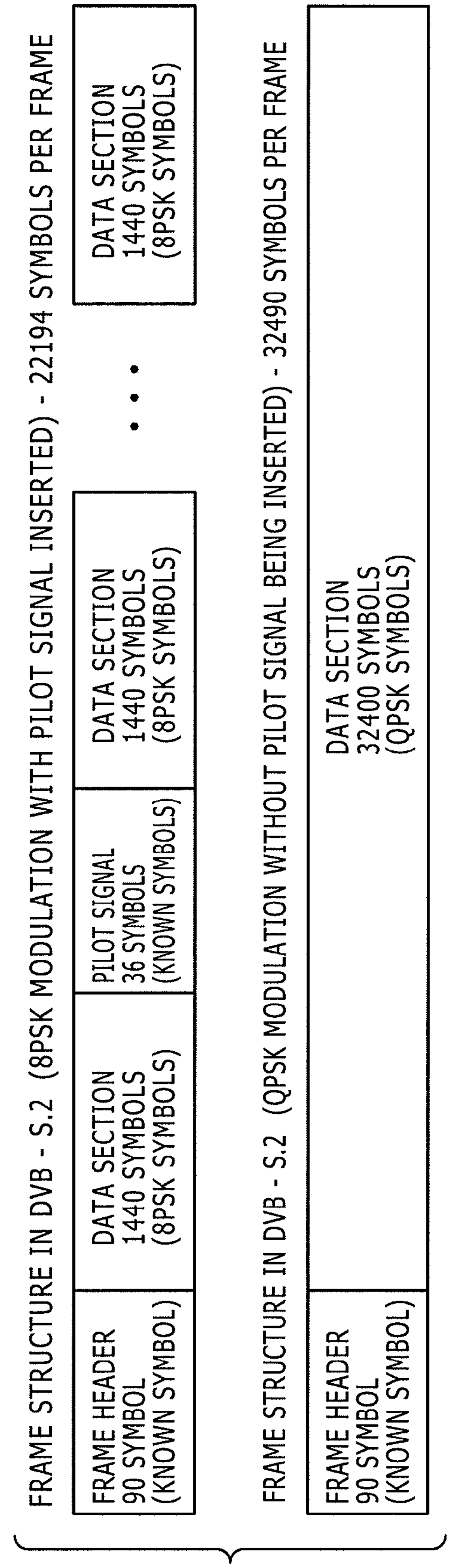
FIG. 8 is a diagram of assistance in explaining frame structures in DVB-S.2.

For example, as shown in FIG. 8, baseband frame structures in the DVB-S.2 standard include a frame structure in which 8PSK (8 Phase Shift Keying) modulation is performed and a pilot signal is inserted, a frame structure in which QPSK (Quadrature Phase Shift Keying) modulation is performed and no pilot signal is inserted.

In the frame structure on the upper side of FIG. 8, a frame header of 90 symbols is followed by a data section of 1440 symbols, and a pilot signal of 36 symbols is inserted following each data section of 1440 symbols. The frame structure on the upper side of FIG. 8 includes 22,194 symbols per frame. Incidentally, in this frame structure, the frame header and the pilot signals are known symbols, and the data sections are main signal symbols (8PSK symbols).

The frame structure on the lower side of FIG. 8 includes a frame header of 90 symbols and a data section of 32400 symbols. The frame structure on the lower side of FIG. 8 thus includes 32,490 symbols per frame. Incidentally, in this frame structure, the frame header is known symbols, and the data section is main signal symbols (QPSK symbols).

In the frame structure of the DVB-S.2 standard on the upper side of FIG. 8 in which 8PSK modulation is performed and pilot signals are inserted, supposing that a symbol rate is 28.8 MS/s, for example, a frequency error where erroneous synchronization occurs in the conventional system as described above is an integral multiple of 20 KHz. In order to achieve synchronization reliably, the frequency error of input of the carrier frequency/phase synchronizing circuit needs to be controlled to less than ±10 kHz.

In the frame structure of the DVB-S.2 standard on the lower side of FIG. 8 in which QPSK modulation is performed and no pilot signals are inserted, a main signal section has 32400 consecutive symbols. Thus, a PLL does not stably converge unless the frequency error of input of the carrier frequency/phase synchronizing circuit is controlled to less than ±400 Hz.

In the present embodiment, description will be made of a carrier frequency/phase synchronizing circuit that can solve such a problem. FIG. 7 shows an example of configuration of such a carrier frequency/phase synchronizing circuit.

Returning to FIG. 7, the phase calculating unit 112 calculates an argument of the input symbol supplied from the IQ rotating unit 111, and then supplies the argument to the phase error estimating unit 113.

The phase error estimating unit 113 estimates a phase error $\theta_n$ of the input symbol from the argument supplied from the phase calculating unit 112, and then outputs the phase error $\theta_n$ to the loop filter 114.

The loop filter 114 filters the phase error $\theta_n$ supplied from the phase error estimating unit 113, and controls the NCO 115 according to a result of the filtering.

The loop filter 114 includes an amplifier 121, an amplifier 122, an arithmetic unit 123, a register 124, and an arithmetic unit 125.

The amplifier 121 amplifies the phase error $\theta_n$ supplied from the phase error estimating unit 113 to a product of the phase error $\theta_n$ and a loop gain $g_1$, and then outputs the result to the amplifier 122 and the arithmetic unit 125.

The amplifier 122 amplifies the output of the amplifier 121 to a product of the output of the amplifier 121 and a loop gain $g_2$, and then outputs the result to the arithmetic unit 123.

The arithmetic unit 123 adds the output of the amplifier 122 to the output of the register 124, and then outputs the result to the register 124.

The register 124 delays the output of the arithmetic unit 123 by the time of one symbol, and then supplies the output to the arithmetic unit 123 and the arithmetic unit 125.

The arithmetic unit 125 adds the output of the amplifier 121 to the output of the register 124, and then supplies the result as a phase correction quantity to the NCO 115.

Thus, in the loop filter 114, the phase error $\theta_n$ is multiplied by the loop gain $g_1$ and the loop gain $g_2$ by the amplifier 121 and the amplifier 122, and a resulting value is added to the register 124. Then, a sum of an output value from the register 124 and a value obtained by multiplying the phase error $\theta_n$ by only the loop gain $g_1$ by the amplifier 121 is output as a phase correction quantity.

Incidentally, the output value of the register 124 converges to a value (estimated frequency error) corresponding to the frequency error of the input symbol.

The NCO 115 generates a signal of a predetermined phase according to the phase correction quantity supplied from the loop filter 114. The NCO 115 then supplies the IQ rotating unit 111 with the signal of the predetermined phase as a signal corresponding to an original signal point (ideal signal point) on an IQ plane of the input symbol.

The gain controlling unit 116 controls the loop gain $g_1$ of the amplifier 121 and the loop gain $g_2$ of the amplifier 122 within the loop filter 114.

The gain controlling unit 116 includes a selector 131, a selector 132, and a selector 133.

The selector 131 and the selector 132 are supplied with a selection signal $S_A$ in same timing. The selection signal $S_A$ is 0 when the input symbol is in a main signal section, and is 1 when the input symbol is in a known section.

Thus, the selector 131 outputs the loop gain $g_1$ for a main signal section to the amplifier 121 when the selection signal $S_A$ is 0, and outputs the loop gain $g_1$ for a known section to the amplifier 121 when the selection signal $S_A$ is 1. The selector 132 outputs the loop gain $g_2$ for a main signal section to the selector 133 when the selection signal $S_A$ is 0, and outputs the loop gain $g_2$ for a known section to the selector 133 when the selection signal $S_A$ is 1.

The selector 133 is supplied with a selection signal $S_B$. The selection signal $S_B$ is 1 for a period of p symbols from a start of a known section in a known symbol count, which is a count of known symbols, and is 0 otherwise.

Thus, when the selection signal $S_B$ is 0, the selector 133 outputs the loop gain $g_2$ for a main signal section or the loop gain $g_2$ for a known section, which loop gain $g_2$ is output from the selector 132, to the amplifier 122. When the selection signal $S_B$ is 1, the selector 133 outputs 0 to the amplifier 122.

That is, because the selection signal $S_B$ is 1 for a period of p symbols from a start of a known section and is 0 otherwise, the selection signal $S_B$ makes the loop gain $g_2$ for a known section and 0 selected as the loop gain $g_2$ in the known section. Thus, even in the known section, the loop gain $g_2$ is 0 for the period of the p symbols from the start of the known section.

An example of control of the loop gains by the gain controlling unit 116 in FIG. 7 will next be described with reference to a timing chart of FIG. 9.

Figure 1:
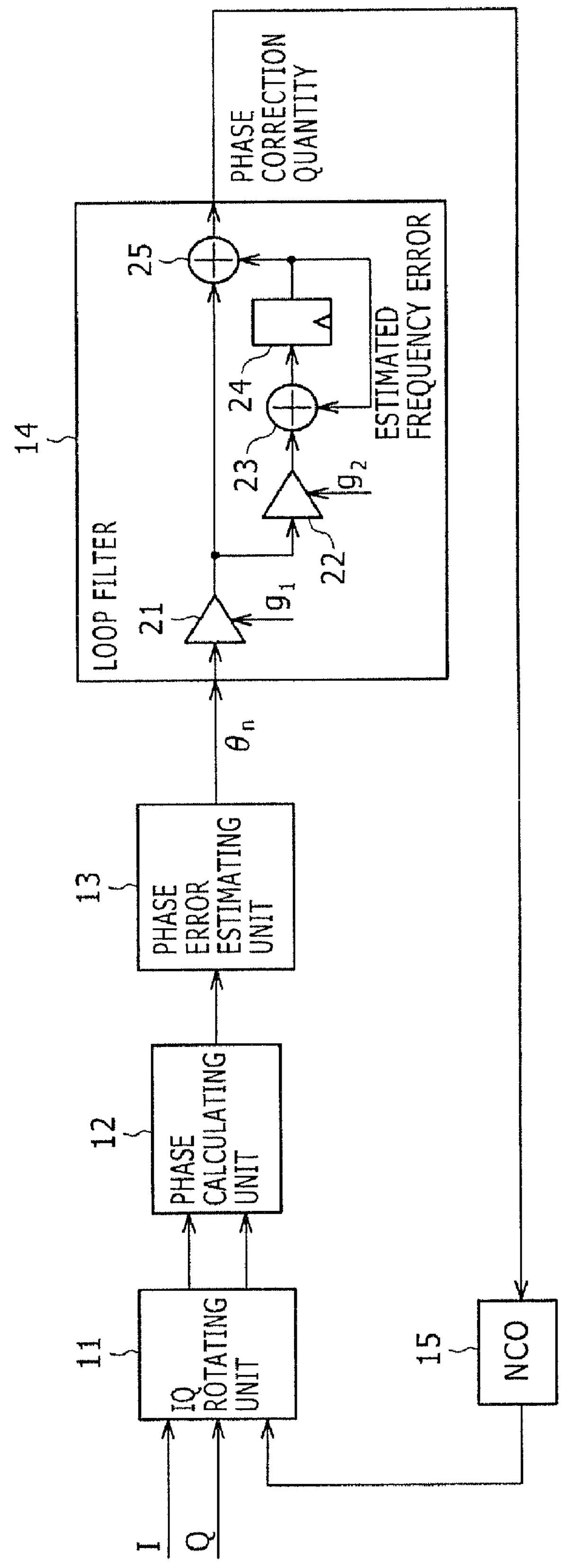
FIG. 1 is a block diagram showing a conventional carrier frequency/phase synchronizing circuit.
Figure 2:
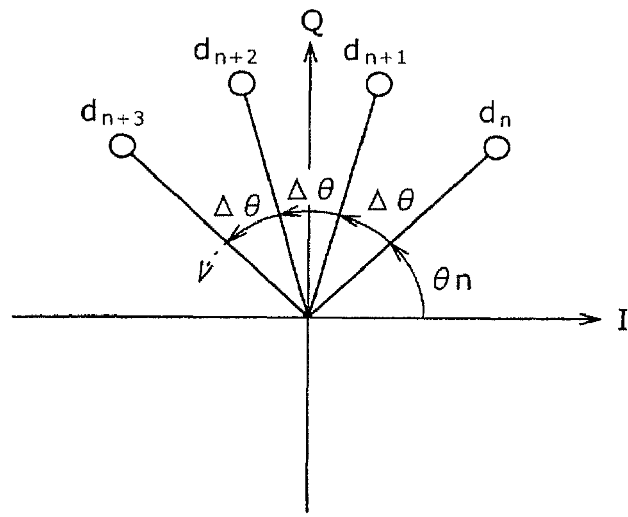
FIG. 2 is a diagram of assistance in explaining a phase error quantity of an input symbol.
Figure 3:
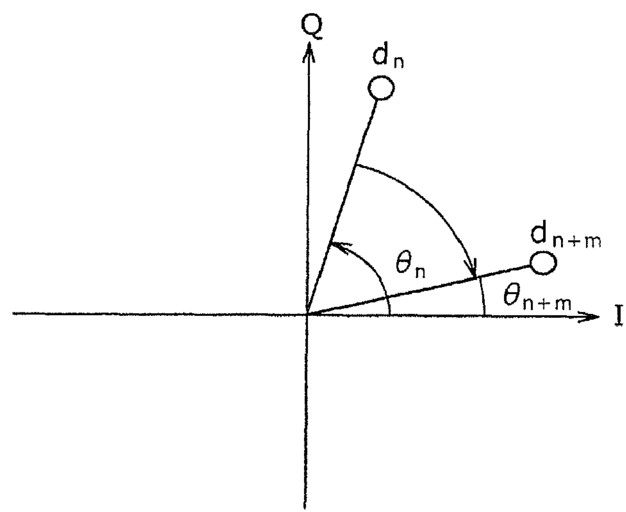
Figure 5:
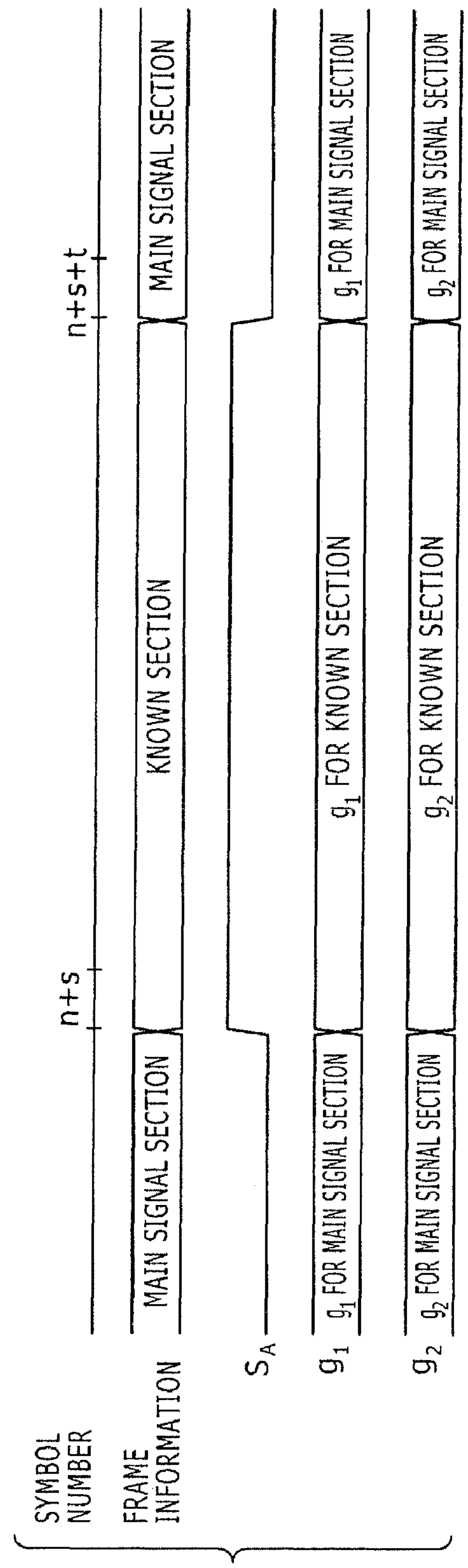
FIG. 5 is a timing chart of assistance in explaining operation of the carrier frequency/phase synchronizing circuit of FIG. 4.
Figure 6:
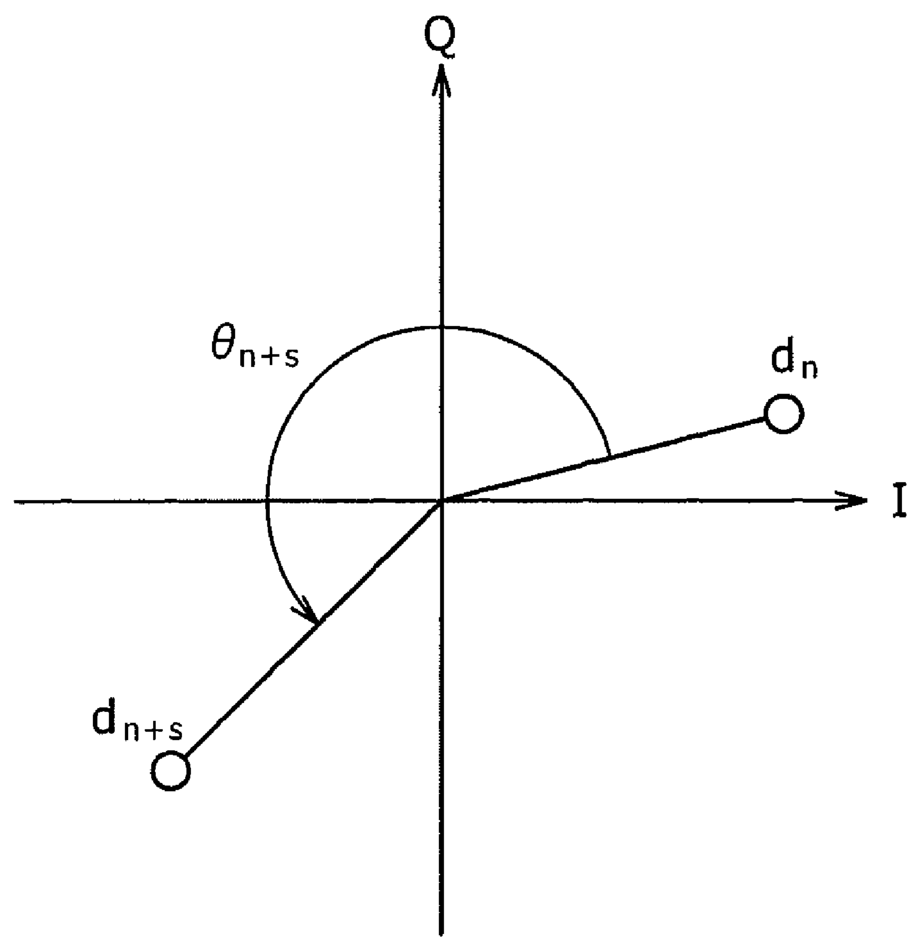
FIG. 6 is a diagram of assistance in explaining phase rotation in a main signal section.

As with the timing chart of FIG. 5, FIG. 9 shows a timing chart of symbol number, frame information, the selection signal $S_A$, the loop gain $g_1$, and the loop gain $g_2$. FIG. 9 also shows a timing chart of the known symbol count and the selection signal $S_B$ between the selection signal $S_A$ and the loop gain $g_1$.

Incidentally, in FIG. 9, the timing chart of the symbol number, the frame information, the selection signal $S_A$, and the loop gain $g_1$ excluding the known symbol count, the selection signal $S_B$, and the loop gain $g_2$ is the same as the timing chart of FIG. 5.

As shown in FIG. 9, in the gain controlling unit 116, when the input symbol is a main signal symbol, the selection signal $S_A$ is 0. Thus, the selector 131 outputs the loop gain $g_1$ for a main signal section to the amplifier 121, and the selector 132 outputs the loop gain $g_2$ for a main signal section to the selector 133. When the input symbol is a main signal symbol, the selection signal $S_B$ is 0, and thus the selector 133 outputs the loop gain $g_2$ for a main signal section from the selector 132 to the amplifier 122.

In the gain controlling unit 116, when the input symbol is a known symbol, the selection signal $S_A$ is 1. Thus, the selector 131 outputs the loop gain $g_1$ for a known section to the amplifier 121, and the selector 132 outputs the loop gain $g_2$ for a known section to the selector 133. When the input symbol is a known symbol, the selection signal $S_A$ is 1, but the selection signal $S_B$ is 1 for a period of p symbols from a start of a known section, so that the selector 133 outputs 0 to the amplifier 122 during the period. When the input symbol thereafter becomes an (n+s+p)th symbol, the selection signal $S_B$ becomes 0, and thus the selector 133 outputs the loop gain $g_2$ for a known section from the selector 132 to the amplifier 122 during a period from the (n+s+p)th symbol to an (n+s+t)th symbol.

Thus, in the carrier frequency/phase synchronizing circuit of FIG. 7, the selection signal $S_B$ is controlled to 1 during the period of the p symbols from an (n+s)th symbol where switching is performed from a main signal section to a known section. Thus, during the period of the p symbols from the start of the known section, the loop gain $g_2$ for the known section is controlled to 0, and phase pull-in is performed without a phase error $\theta_{n+s}$ affecting the register value of the register 124 in the loop filter 114 during the period of the p symbols.

As a result, letting $\Delta\theta_{n+s}$ be an amount of phase rotation per symbol due to the residual frequency error of the (n+s)th symbol, the relation of the following Equation (4) holds for a phase error $\theta_{n+s+p}$ of the (n+s+p)th symbol.

$$\theta_{n+s+p}=(1-g_1)^p\theta_{n+s}+\{1-(1-g_1)^p\}\Delta\theta_{n+s}/g_1 \quad (4)$$

Thus, the effect of the phase error $\theta_{n+s}$ at the start of the known section can be reduced according to the magnitude of p. In addition, by selecting p and the loop gain $g_1$ appropriately for the estimated frequency error and an amount of noise, the phase error $\theta_{n+s+p}$ has the same sign as the amount of phase rotation $\Delta\theta_{n+s}$, so that the convergence of the loop filter 114 is neither prevented nor made unstable.

That is, the carrier frequency/phase synchronizing circuit of FIG. 7 controls the loop gain $g_2$ to 0 to prevent the effect of the phase error $\theta_{n+s}$ from being produced on the value retained at the time of filtering by the loop filter 114 when phase pull-in is performed in the section from the start of the known section to the pth symbol.

Incidentally, for example, the value of 16 symbols or the like is set as the value of p. By increasing the value of p, the effect of noise can be reduced. By decreasing the value of p, the specified frequency error can be made to converge more quickly.

The carrier frequency/phase synchronizing circuit of FIG. 7 can be for example applied to a receiving device receiving a modulated signal resulting from digital modulation of a carrier in CS (Communication Satellite) digital broadcasting, BS (Broadcasting Satellite) digital broadcasting or the like.

An example of operation of this receiving device is described as follows. For example, a broadcast wave of CS digital broadcasting is received by an antenna, and a modulated signal as an IF (Intermediate Frequency) signal, that is, a modulated signal modulated in a broadcasting station performing the CS digital broadcasting is supplied to a tuner. This tuner multiplies the IF signal of the modulated signal supplied thereto by a carrier. The tuner thereby demodulates the IF signal of the modulated signal into a demodulated signal including an I-component in phase with the carrier and a Q-component orthogonal to the carrier. This demodulated signal is subjected to A/D (Analog/Digital) conversion to become a digital demodulated signal.

That is, the carrier frequency/phase synchronizing circuit of FIG. 7 is supplied with the digital demodulated signal (input symbol (IQ signal)) obtained by this A/D conversion. The carrier frequency/phase synchronizing circuit of FIG. 7 for example establishes carrier synchronism for the input symbol using, as required, known symbol information from a frame synchronizing unit for establishing frame synchronism and TMCC (Transmission Multiplexing Configuration Control) from a TMCC detecting unit for detecting the TMCC as a control signal including the modulation system of a main signal from decoded data. The carrier frequency/phase synchronizing circuit thereby obtains the demodulated signal whose symbol rotation is corrected.

The demodulated signal whose symbol rotation is corrected by establishing carrier synchronism by the carrier frequency/phase synchronizing circuit of FIG. 7 is then supplied to a decoding unit. The decoding unit subjects the demodulated signal supplied from the carrier frequency/phase synchronizing circuit of FIG. 7 to for example a decoding process such as Viterbi decoding, a Reed-Solomon code and the like, and then supplies resulting decoded data to a decoder and the TMCC detecting unit. The decoder subjects for example coded data resulting from MPEG (Moving Picture Experts Group) coding as a main signal of the decoded data from the decoding unit to MPEG decoding, and then outputs resulting data such as image data, audio data and the like.

As described above, by employing the carrier frequency/phase synchronizing circuit of FIG. 7, it is possible to achieve one of objects of the present invention, that is, an object of being able to reduce the effect of a phase error $\theta_{n+s}$ at a start of a known section and at the same time eliminate a factor in preventing the convergence of the loop filter or making the convergence of the loop filter unstable.

However, as is understood from the above-described Equation (4), the carrier frequency/phase synchronizing circuit of FIG. 7 does not completely eliminate the effect of the phase error $\theta_{n+s}$.

Accordingly, the present inventor has invented a carrier frequency/phase synchronizing circuit that can completely eliminate the effect of the phase error $\theta_{n+s}$. Specifically, the carrier frequency/phase synchronizing circuit further invented by the present inventor is a carrier frequency/phase synchronizing circuit that can completely eliminate the effect of the phase error $\theta_{n+s}$ and thereby achieve an object of improving the converging performance of the PLL as compared with that of FIG. 7. An embodiment of such a carrier frequency/phase synchronizing circuit is shown in FIG. 10.

FIG. 10 is a block diagram of assistance in explaining another configuration of an embodiment of a carrier frequency/phase synchronizing circuit to which the present invention is applied.

Incidentally, in FIG. 10, parts similar to those of FIG. 7 are identified by the same reference numerals, and repeated description of parts performing the same process will be omitted. In this example, a gain controlling unit 141 is provided in place of the gain controlling unit 116, and a phase error average calculating unit 142 and an arithmetic unit 143 are further provided.

The gain controlling unit 141 includes a selector 131, a selector 132, and a selector 151. The gain controlling unit 141 controls the loop gain $g_1$ of an amplifier 121 and the loop gain $g_2$ of an amplifier 122 within a loop filter 114. In the gain controlling unit 141, the selector 151 is connected to the selector 131 side rather than the selector 132 side.

As described above, the selector 131 and the selector 132 are supplied with a selection signal $S_A$ in same timing. The selector 131 outputs the loop gain $g_1$ for a main signal section to the selector 151 when the selection signal $S_A$ is 0, and outputs the loop gain $g_1$ for a known section to the selector 151 when the selection signal $S_A$ is 1.

The selector 151 is supplied with a selection signal $S_B$. The selector 151 outputs the loop gain $g_1$ for a main signal section or the loop gain $g_1$ for a known section, which loop gain $g_1$ is output from the selector 131, to the amplifier 121 when the selection signal $S_B$ is 0. The selector 151 outputs 0 to the amplifier 121 when the selection signal $S_B$ is 1.

That is, the selection signal $S_B$ is 1 for a period of p symbols from a start of a known section in a known symbol count, and is 0 otherwise. The selection signal $S_B$ thereby makes the loop gain $g_1$ for a known section and 0 selected as the loop gain $g_1$ in the known section. Thus, even in the known section, the loop gain $g_1$ is 0 for the period of the p symbols from the start of the known section.

The selector 132 outputs the loop gain $g_2$ for a main signal section to the amplifier 122 without passing through a selector when the selection signal $S_A$ is 0, and outputs the loop gain $g_2$ for a known section to the amplifier 122 when the selection signal $S_A$ is 1.

The phase error average calculating unit 142 is supplied with a phase error $\theta_n$ from a phase error estimating unit 113. The phase error average calculating unit 142 calculates an average value of the phase error on the basis of the phase error $\theta_n$ from the phase error estimating unit 113, and then outputs the average value of the phase error to the arithmetic unit 143.

The phase error average calculating unit 142 includes an arithmetic unit 161, a selector 162, a register 163, a normalizing unit 164, and a selector 165.

The arithmetic unit 161 adds the phase error $\theta_n$ from the phase error estimating unit 113 to the output of the register 163, and then supplies the result to the selector 162.

The selector 162 is supplied with the selection signal $S_B$. The selector 162 supplies 0 to the register 163 and the normalizing unit 164 when the selection signal $S_B$ is 0, and supplies the output of the arithmetic unit 161 to the register 163 and the normalizing unit 164 when the selection signal $S_B$ is 1 (for a period of p symbols from a start of a known section).

The register 163 delays the output of the selector 162 by the time of one symbol, and then supplies the output to the arithmetic unit 161.

The normalizing unit 164 is supplied with the output of the selector 162, that is, a result of continuing adding the phase error $\theta_n$ during the period of the p symbols from the start of the known section during which the selection signal $S_B$ is 1. The normalizing unit 164 divides the addition result by p, thereby obtains the average value of the phase error $\theta_n$, and then supplies the average value of the phase error $\theta_n$ to the selector 165.

Letting $\theta_{avg}$ be the phase error average value at an (n+s+p−1)th symbol, the phase error average value $\theta_{avg}$ is obtained by the following Equation (5).

$$\theta_{avg}=\theta_{n+s}+(p-1)\Delta\theta_{n+s}/2 \tag{5}$$

Specifically, as shown in FIG. 11, the phase error at the start of the known section is $\theta_{n+s}$, the phase error of a following (n+s+1)th input symbol is $\theta_{n+s}+\Delta\theta_{n+s}$, the phase error of an (n+s+2)th input symbol is $\theta_{n+s+1}+\Delta\theta_{n+s}$, . . . , and the phase error of an (n+s+p−1)th input symbol is $\theta_{n+s+p-2}+\Delta\theta_{n+s}$. That is, the phase error average value $\theta_{avg}$ is the average value of the phase errors of the p symbols from the (n+s)th symbol to the (n+s+p−1)th symbol.

The selector 165 is supplied with a selection signal $S_C$. The selection signal $S_C$ is 1 at the time of the (n+s+p−1)th input symbol, and is 0 otherwise. Hence, the selector 165 outputs 0 to the arithmetic unit 143 when the selection signal $S_C$ is 0, and outputs the phase error average value $\theta_{avg}$ supplied from the normalizing unit 164 to the arithmetic unit 143 when the selection signal $S_C$ is 1 (at the time of the (n+s+p−1)th input symbol).

The arithmetic unit 143 adds a phase correction quantity supplied from the loop filter 114 to the phase error average value $\theta_{avg}$ from the phase error average calculating unit 142, and then supplies the result as a phase correction quantity to an NCO 115.

That is, the carrier frequency/phase synchronizing circuit of FIG. 10 adds the phase error average value $\theta_{avg}$ to the phase correction quantity by setting the selection signal $S_C$ to 1 only at the time of the (n+s+p−1)th symbol, and thereby corrects the phase error. Thus, as shown in FIG. 12, the phase error $\theta_{n+s+p-1}$ (fourth quadrant in the figure) of the (n+s+p−1)th symbol is corrected to a phase error $\theta_{n+s+p}$ (first quadrant in the figure) at the time of an (n+s+p)th symbol as a symbol following the (n+s+p−1)th symbol.

As a result, a frequency error $\downarrow'_{n+s+p}$ at the time of the (n+s+p)th symbol is obtained by the following Equation (6).

$$\theta'_{n+s+p}=(p+1)\Delta\theta_{n+s}/2 \tag{6}$$

Thus, in Equation (6), the effect of the phase error $\theta_{n+s}$ at the start of the known section is completely eliminated. In addition, by selecting p appropriately for an estimated frequency error and an amount of noise, $\theta'_{n+s+p}$ has the same sign as $\Delta\theta_{n+s}$, so that the convergence of the loop filter 114 is neither prevented nor made unstable.

Then, the NCO 115 generates a predetermined phase signal according to the phase correction quantity supplied from the arithmetic unit 143, and then supplies an IQ rotating unit 111 with the predetermined phase signal as a signal corresponding to an original signal point (ideal signal point) on an IQ plane of the input symbol.

Incidentally, other configurations in the carrier frequency/phase synchronizing circuit of FIG. 10 are the same as in the carrier frequency/phase synchronizing circuit of FIG. 7.

An example of phase correction by the gain controlling unit 141, the phase error average calculating unit 142, and the arithmetic unit 143 in FIG. 10 will next be described with reference to a timing chart of FIG. 13.

As with the timing chart of FIG. 9, FIG. 13 shows a timing chart of symbol number, frame information, the selection signal $S_A$, the known symbol count, the selection signal $S_B$, the loop gain $g_1$, and the loop gain $g_2$. FIG. 13 also shows a timing chart of the selection signal $S_C$ and the phase error average output under the loop gain $g_2$.

Incidentally, in FIG. 13, the timing chart of the symbol number, the frame information, the selection signal $S_A$, the known symbol count, and the selection signal $S_B$ excluding the loop gain $g_1$, the loop gain $g_2$, the selection signal $S_C$, and the phase error average output is the same as the timing chart of FIG. 9.

As shown in FIG. 13, in the gain controlling unit 141, when the input symbol is a main signal symbol, the selection signal $S_A$ is 0. Thus, the selector 131 outputs the loop gain $g_1$ for a main signal section to the selector 151, and the selector 132 outputs the loop gain $g_2$ for a main signal section to the amplifier 122. When the input symbol is a main signal symbol, the selection signal $S_B$ is 0, and thus the selector 151 outputs the loop gain $g_1$ for a main signal section from the selector 131 to the amplifier 121.

In the gain controlling unit 141, when the input symbol is a known symbol, the selection signal $S_A$ is 1. Thus, the selector 131 outputs the loop gain $g_1$ for a known section to the selector 151, and the selector 132 outputs the loop gain $g_2$ for a known section to the amplifier 122. When the input symbol is a known symbol, the selection signal $S_A$ is 1, but the selection signal $S_B$ is 1 for a period of p symbols from a start of a known section, so that the selector 151 outputs 0 to the amplifier 121 during the period. Thus, phase error correction is stopped during the period of the p symbols from the start of the known section.

The phase error average calculating unit 142 calculates the phase error average value $\theta_{avg}$, and when the input symbol becomes an (n+s+p−1)th input symbol, the selection signal $S_C$ becomes 1, and thus the phase error average calculating unit 142 outputs the phase error average value $\theta_{avg}$ to the arithmetic unit 143. Then, as shown in FIG. 12, the arithmetic unit 143 adds the phase correction quantity from the loop filter 114 to the phase error average value $\theta_{avg}$ from the phase error average calculating unit 142, and thereby corrects an initial phase error.

When the input symbol becomes an (n+s+p)th symbol, the selection signal $S_B$ becomes 0, and thus the selector 151 outputs the loop gain $g_1$ for a known section from the selector 131 to the amplifier 121 until an (n+s+t)th symbol. At this time, the arithmetic unit 143 supplies a phase correction quantity to the NCO 115 according to the output from the loop filter 114.

As described above, the carrier frequency/phase synchronizing circuit of FIG. 10 averages the initial phase error between the p symbols from the (n+s)th symbol, and adds the average value to the phase error quantity output from the loop filter 114, thereby making phase correction. In addition, by controlling the selection signal $S_B$ to 1 during the period of the p symbols from the (n+s)th symbol, the loop gain $g_1$ for a known section is controlled to 0 during the period of the p symbols from the start of the known section, and thus phase error correction is stopped during the period of the p symbols.

Thus, as is also shown in the above Equation (6), the effect of the phase error $\theta_{n+s}$ detected at the start of the known section, that is, the initial phase error can be eliminated completely. As a result, the PLL can converge accurately.

It is also possible to eliminate the effect of the phase error $\theta_{n+s}$ by for example adding the phase error average value $\theta_{avg}$ to the phase of an estimated ideal symbol rather than adding the phase error average value $\theta_{avg}$ to the phase correction quantity from the loop filter 114 as described above. Accordingly, description will next be made of a method of eliminating the effect of the phase error $\theta_{n+s}$ by adding the phase error average value $\theta_{avg}$ to the phase of an estimated ideal symbol.

FIG. 14 is a block diagram of assistance in explaining another configuration of an embodiment of a carrier frequency/phase synchronizing circuit to which the present invention is applied.

Incidentally, in FIG. 14, parts similar to those of FIG. 10 are identified by the same reference numerals, and repeated description of parts performing the same process will be omitted. In this example, a phase error estimating unit 171 and a phase error average calculating unit 172 are provided in place of the phase error estimating unit 113 and the phase error average calculating unit 142, and the arithmetic unit 143 is removed.

The phase error estimating unit 171 is supplied with the phase of an input symbol from a phase calculating unit 112. The phase error estimating unit 171 estimates a phase error between the input symbol from the phase calculating unit 112 and an ideal value according to a phase error average value $\theta_{avg\_hold}$ from the phase error average calculating unit 172. The phase error estimating unit 171 sets the estimated phase error as a phase error $\theta_n$, and then supplies the phase error $\theta_n$ to a loop filter 114 and the phase error average calculating unit 172.

The phase error estimating unit 171 includes a transmission symbol phase estimating unit 181, an arithmetic unit 182, and an arithmetic unit 183.

The transmission symbol phase estimating unit 181 supplies the arithmetic unit 182 with information serving as a known symbol reference on the basis of hard decision, for example, as an ideal signal point (ideal value).

The arithmetic unit 182 adds the phase error average value $\theta_{avg\_hold}$ from the phase error average calculating unit 172 to the ideal signal point from the transmission symbol phase estimating unit 181, and then supplies the result to the arithmetic unit 183.

The arithmetic unit 183 calculates a difference between the phase of the ideal signal point from the arithmetic unit 182 to which the phase error average value $\theta_{avg\_hold}$ is added and the phase of the input symbol calculated by the phase calculating unit 112. The arithmetic unit 183 sets the difference as a phase error $\theta_n$, and then supplies the phase error $\theta_n$ to the loop filter 114 and the phase error average calculating unit 172.

The phase error average calculating unit 172 is supplied with the phase error $\theta_n$ from the phase error estimating unit 171. The phase error average calculating unit 172 calculates a phase error average value $\theta_{avg}$ on the basis of the phase error $\theta_n$ from the phase error estimating unit 171. When the phase error average value $\theta_{avg}$ becomes an average of phase errors of p symbols from an (n+s)th symbol to an (n+s+p−1)th symbol, the phase error average calculating unit 172 sets the phase error average value $\theta_{avg}$ as a phase error average value $\theta_{avg\_hold}$, and supplies the phase error average value $\theta_{avg\_hold}$ to the phase error estimating unit 171.

Incidentally, as compared with the phase error average calculating unit 142 in FIG. 10, the phase error average calculating unit 172 is provided with a register 191 in place of the selector 165. The register 191 retains the phase error average value $\theta_{avg}$ of the p symbols as the phase error average value $\theta_{avg\_hold}$ for a period from a next symbol to first p symbols of next known symbols.

Incidentally, other configurations in the carrier frequency/phase synchronizing circuit of FIG. 14 are the same as in the carrier frequency/phase synchronizing circuit of FIG. 10.

An example of phase correction by the phase error estimating unit 171 and the phase error average calculating unit 172 in FIG. 14 will next be described with reference to a timing chart of FIG. 15.

As with the timing chart of FIG. 13, FIG. 15 shows a timing chart of symbol number, frame information, a selection signal $S_A$, a known symbol count, a selection signal $S_B$, a loop gain $g_1$, and a loop gain $g_2$. FIG. 15 shows a timing chart of the phase error average value $\theta_{avg\_hold}$ in place of the timing chart of the selection signal $S_C$ and the phase error average output under the loop gain $g_2$.

Incidentally, in FIG. 15, the timing chart of the symbol number, the frame information, the selection signal $S_A$, the known symbol count, the selection signal $S_B$, the loop gain $g_1$, and the loop gain $g_2$ excluding the phase error average value $\theta_{avg\_hold}$ is the same as the timing chart of FIG. 13.

As shown in FIG. 15, the phase error average calculating unit 172 supplies the phase error average value $\theta_{avg}$ calculated when an input symbol is a pth symbol (an (n+s+p−1)th input symbol) from a start of a known section to the phase error estimating unit 171 in timing of a next symbol. The phase error estimating unit 171 estimates a phase error $\theta_n$ between the received input symbol and an ideal value according to the phase error average value $\theta_{avg\_hold}$ from the phase error average calculating unit 172.

Incidentally, the phase error average value $\theta_{avg\_hold}$ is retained for a period of a section of one frame. Hence, the phase error average value $\theta_{avg\_hold}$ is retained until a next known section, and is updated to a phase error average value $\theta_{avg}$ calculated between first p symbols of the known section at the time of a pth symbol.

As described above, the carrier frequency/phase synchronizing circuit to which the present invention is applied can make the convergence of the PLL accurate, and solve the conventional problem of erroneous synchronization with an integral multiple of a specific frequency. In addition, synchronization can be established stably and surely even in a low C/N environment.

For example, in the frame structure of the DVB-S.2 standard on the lower side of FIG. 8 in which QPSK modulation is performed and no pilot signals are inserted, s=32,400, and t=90. In this case, even in a low C/N environment with C/N=0.0 dB or so, it is possible to pull in a frequency error of 1 MHz or more (supposing that a symbol rate is 28.8 MS/s) with p=16 or so, and thereby establish synchronism stably.

In addition, the present invention is effective especially in a frame structure including a small number of known symbols such as the frame structure of DVB-S.2, for example.

It is to be noted that in the present specification, steps describing a program stored on a recording medium include not only processes carried out in time series in the described order but also processes carried out in parallel or individually and not necessarily in time series.

In addition, embodiments of the present invention are not limited to the above-described embodiments, and various changes can be made without departing from the spirit of the present invention.

What is claimed is:

1. A synchronizing circuit comprising:

numerically controlled oscillating means for generating a signal of a predetermined phase;

phase rotating means for rotating a phase of a symbol of a demodulated signal obtained by demodulating a modulated signal resulting from digital modulation of a carrier according to the signal of said predetermined phase, said demodulated signal including an I-component in phase with said carrier and a Q-component orthogonal to said carrier;

phase error estimating means for estimating a phase error from the rotated phase of the symbol of said demodulated signal;

a loop filter for filtering said phase error and controlling said numerically controlled oscillating means according to a result of the filtering; and gain controlling means for controlling first and second gains of said loop filter in symbol units of said demodulated signal, the symbol units forming one of (a) a known section as a section of known symbols and (b) a main signal section as a section of main signal symbols;

wherein said gain controlling means controls said first and second gains so as to suppress an effect of a phase error in an immediate main signal section in a known start section from a start of said known section to a predetermined symbol;

phase error average calculating means for calculating an average value of the phase error in said known start section; and adding means for adding the calculated said average value to a phase correction quantity as output of said loop filter;

wherein said gain controlling means controls said first and second gains such that phase error correction in said known start section is stopped in said loop filter, said adding means adds said average value to said phase correction quantity when the symbol of said demodulated signal becomes the predetermined symbol, and said numerically controlled oscillating means generates the signal of said predetermined phase according to the phase correction quantity to which said average value is added.

2. The synchronizing circuit according to claim 1, wherein said main signal section is a data section, and said known section is a frame header and a pilot signal when the pilot signal is inserted and is a frame header when the pilot signal is not inserted.

3. A synchronizing circuit comprising:

numerically controlled oscillating means for generating a signal of a predetermined phase;

phase rotating means for rotating a phase of a symbol of a demodulated signal obtained by demodulating a modulated signal resulting from digital modulation of a carrier according to the signal of said predetermined phase, said demodulated signal including an I-component in phase with said carrier and a Q-component orthogonal to said carrier;

phase error estimating means for estimating a phase error from the rotated phase of the symbol of said demodulated signal;

a loop filter for filtering said phase error and controlling said numerically controlled oscillating means according to a result of the filtering; and gain controlling means for controlling first and second gains of said loop filter in symbol units of said demodulated signal, the symbol units forming one of (a) a known section as a section of known symbols and (b) a main signal section as a section of main signal symbols;

wherein said gain controlling means controls said first and second gains so as to suppress an effect of a phase error in an immediate main signal section in a known start section from a start of said known section to a predetermined symbol, phase error average calculating means for calculating an average value of the phase error in said known start section, wherein said phase error estimating means estimates said phase error from a difference between the phase of the symbol of said demodulated signal and a phase obtained by adding the calculated said average value to an ideal signal point when the symbol of said demodulated signal becomes said predetermined symbol, said gain controlling means controls said first and second gains such that phase error correction in said known start section is stopped in said loop filter, and said loop filter subjects the estimated phase error to filtering and controls said numerically controlled oscillating means according to a result of the filtering.

4. The synchronizing circuit according to claim 3, wherein said main signal section is a data section, and said known section is a frame header and a pilot signal when the pilot signal is inserted and is a frame header when the pilot signal is not inserted.

5. A control method of a synchronizing circuit, said synchronizing circuit including numerically controlled oscillating means for generating a signal of a predetermined phase, phase rotating means for rotating a phase of a symbol of a demodulated signal obtained by demodulating a modulated signal resulting from digital modulation of a carrier according to the signal of said predetermined phase, said demodulated signal including an I-component in phase with said carrier and a Q-component orthogonal to said carrier, phase error estimating means for estimating a phase error from the rotated phase of the symbol of said demodulated signal, a loop filter for filtering said phase error and controlling said numerically controlled oscillating means according to a result of the filtering, and gain controlling means for controlling first and second gains of said loop filter in symbol units of said demodulated signal, said symbol units forming one of (a) a known section as a section of known symbols and (b) a main signal section as a section of main signal symbols, phase error average calculating means for calculating an average value of the phase error in said known start section, and adding means for adding the calculated said average value to a phase correction quantity as output of said loop filter; said control method comprising the step of:

controlling said first and second gains such that phase error correction in said known start section is stopped in said loop filter, adding said average value to said phase correction quantity when the symbol of said demodulated signal becomes the predetermined symbol, and generating the signal of said predetermined phase according to the phase correction quantity to which said average value is added.

6. A control method of a synchronizing circuit, said synchronizing circuit including numerically controlled oscillating means for generating a signal of a predetermined phase, phase rotating means for rotating a phase of a symbol of a demodulated signal obtained by demodulating a modulated signal resulting from digital modulation of a carrier according to the signal of said predetermined phase, said demodulated signal including an I-component in phase with said carrier and a Q-component orthogonal to said carrier, phase error estimating means for estimating a phase error from the rotated phase of the symbol of said demodulated signal, a loop filter for filtering said phase error and controlling said numerically controlled oscillating means according to a result of the filtering, and gain controlling means for controlling first and second gains of said loop filter in symbol units of said demodulated signal, said symbol units forming one of (a) a known section as a section of known symbols and (b) a main signal section as a section of main signal symbols, phase error average calculating means for calculating an average value of the phase error in said known start section; said control method comprising the step of:

estimating said phase error from a difference between the phase of the symbol of said demodulated signal and a phase obtained by adding the calculated said average value to an ideal signal point when the symbol of said demodulated signal becomes said predetermined symbol, controlling said first and second gains such that phase error correction in said known start section is stopped in said loop filter, and subjecting the estimated phase error to filtering and controlling said numerically controlled oscillating means according to a result of the filtering.

* * * * *